(12) United States Patent
Paranjape et al.

(10) Patent No.: US 8,766,330 B2
(45) Date of Patent: Jul. 1, 2014

(54) METHOD AND SYSTEM FOR GENERATING A PHOTO-RESPONSE FROM MOS$_2$ SCHOTTKY JUNCTIONS

(71) Applicants: Makarand Paranjape, Silver Spring, MD (US); Paola Barbara, Washington, DC (US); Amy Liu, Alexandria, VA (US); Marcio Fontana, Salvador (BR)

(72) Inventors: Makarand Paranjape, Silver Spring, MD (US); Paola Barbara, Washington, DC (US); Amy Liu, Alexandria, VA (US); Marcio Fontana, Salvador (BR)

(73) Assignee: Georgetown University, Washington, DC (US)

( * ) Notice: Subject to any disclaimer, the term of this patent is extended or adjusted under 35 U.S.C. 154(b) by 0 days.

(21) Appl. No.: 13/661,979

(22) Filed: Oct. 26, 2012

(65) Prior Publication Data

US 2013/0105824 A1    May 2, 2013

Related U.S. Application Data

(60) Provisional application No. 61/552,914, filed on Oct. 28, 2011, provisional application No. 61/616,202, filed on Mar. 27, 2012.

(51) Int. Cl.
*H01L 31/108* (2006.01)
(52) U.S. Cl.
USPC ............................... 257/257; 257/86
(58) Field of Classification Search
None
See application file for complete search history.

(56) References Cited

U.S. PATENT DOCUMENTS

| | | | |
|---|---|---|---|
| 3,051,840 A * | 8/1962 | Davis | 257/257 |
| 4,532,536 A | 7/1985 | Hatanaka et al. | 257/449 |
| 4,984,041 A | 1/1991 | Hack et al. | 257/60 |
| 5,079,620 A * | 1/1992 | Shur | 257/285 |
| 6,050,827 A * | 4/2000 | Takechi et al. | 438/40 |
| 7,307,277 B2 * | 12/2007 | Frey et al. | 257/40 |
| 7,476,930 B2 | 1/2009 | Allibert et al. | 257/327 |
| 7,956,525 B2 * | 6/2011 | Armitage et al. | 313/309 |
| 2003/0140959 A1 * | 7/2003 | Gaudiana et al. | 136/244 |
| 2004/0108511 A1 | 6/2004 | Baik et al. | 257/98 |
| 2005/0269564 A1 | 12/2005 | Narayan | 257/40 |
| 2007/0278478 A1 * | 12/2007 | Zaumseil et al. | 257/40 |
| 2007/0295955 A1 | 12/2007 | Chua et al. | 257/40 |
| 2008/0096291 A1 * | 4/2008 | Takai et al. | 438/7 |
| 2009/0014757 A1 | 1/2009 | Takulapalli et al. | 257/253 |
| 2009/0166686 A1 | 7/2009 | Hunt et al. | 257/288 |
| 2010/0013014 A1 | 1/2010 | Snyder et al. | 257/347 |
| 2010/0140622 A1 | 6/2010 | Lee et al. | 257/59 |
| 2010/0200047 A1 * | 8/2010 | Ostermann | 136/249 |
| 2011/0120519 A1 | 5/2011 | Clevenger et al. | 136/244 |
| 2011/0207300 A1 | 8/2011 | Brown et al. | 438/479 |

OTHER PUBLICATIONS

Mak, K. F., Lee, C., Hone, J., Shan, J., and Heinz, T. F. (2010). Atomically thin MoS2: A new direct-gap semiconductor. Phys. Rev. Lett.*

(Continued)

*Primary Examiner* — Charles Garber
*Assistant Examiner* — Alia Sabur
(74) *Attorney, Agent, or Firm* — Dawn-Marie Bey; Bey & Cotropia PLLC (57) ABSTRACT

Devices incorporating a single to a few-layer MoS$_2$ channels in combination with optimized substrate, dielectric, contact and electrode materials and configurations thereof, exhibit light emission, photoelectric effect, and superconductivity, respectively.

22 Claims, 11 Drawing Sheets

(56) References Cited

OTHER PUBLICATIONS

Sheraw, C.D., Zhou, L., Huang, J. R., Gundlach, D. J., Jackson, T.N., Kane, M. G., Hill, I. G., Hammond, M. S., Campi, J., Greening, B. K., Francl, J., West, J. Organic thin-film transistor-driven polymer-dispersed liquid crystal displays on flexible polymeric substrates. Appl. Phys. Lett. 80, 1088 (2002).*

Yin, Z., et al. Single-Layer MoS2 Phototransistors, ACS Nano, 2012, 6 (1), pp. 74-80.*

Yoon. Y, et al. How Good Can Monolayer MoS2 Transistors Be?, Nano Lett., 2011, 11(9), pp. 3768-3773.*

Radisavlejevic, B., et al. Single-layer MoS2 transistors, Nature Nanotechnology, 6, 2011, p. 147-150.*

Kuc, A., et al., "Influence of Quantum Confinement on the Electronic Structure of the Transition Metal Sulfide TS(2)," Physical Review B, 83, 245213-245217 (2011).

Novoselov, K. S., "Electric Field Effect in Atomically Thin Carbon Films," Science 306, 666-669 (2004).

Radisavljevic, B., et al., "Single-Layer $MoS_x$ Transistors," Nature Nanotechnology 6, 147-150 (2011).

Mak, K. F., et al., "Atomically Thin $MoS_x$: A New Direct Gap Semiconductor," Phys.-Rev. Lett. 105, 136805 (2010).

Vasudevan, S., et al., "Modeling Electrostatic and Quantum Detection of Molecules," IEEE Sensors J. 8, 857-862 (2008).

J. Zhang, et al., "Mechanism of $NO_2$ Detection in Carbon Nanotube Field Effect Transistor Chemical Sensors," Appl. Phys. Lett. 88, 123112-123115 (2006).

Li, H., et al., "Fabrication of Single- and Multilayer $MoS_2$ Film-Based Field-Effect Transistors for Sensing NO at Room Temperature," Small 8, 63-67 (2012).

Lince, J. R., et al., "Schottky-Barrier Formation on a Covalent Semiconductor Without Fermi-Level Pinning—the Metal—$MoS_2(0001)$ Interface," Physical Review B 36, 1647-1656 (1987).

Monch, W., "Valence-Band Offsets and Schottky Barrier Heights of Layered Semiconductors Explained by Interface-Induced Gap States," Applied Physics Letters 72, 1899-1901 (1998).

Fuhr, J. D., et al., "Coverage Dependence Study of the Adsorption of Pd on $MoS_2(0001)$," Surface Science 506, 161-171 (2002).

Fuhr, J. D., et al., "Adsorption of Pd on $MoS_2(0001)$: Ab Initio Electronic-Structure Calculations," Physical Review B 60, 8343-8347 (1999).

Popov, I., et al., "Designing Electrical Contacts to $MoS_2$ Monolayers: A Computational Study," Physical Review Letter 108 (Accepted Monday, Feb. 27, 2012).

Schlaf, R., et al., "Band Lineup of Layered Semiconductor Heterointerfaces Prepared by van der Waals Epitaxy: Charge Transfer Correction Term for the Electron Affinity Rule," Journal of Applied Physics 85, 2732-2753 (1999).

Fortin, E., et al., Photo-Voltaic Effect and Optical-Absorption in $MoS_2$, Journal of Physics and Chemistry of Solids 43, 881-884 (1982).

International Search Report and Written Opinion for Application Serial No.PCT/US2012/062130, 9 pp., Jan. 9, 2013.

* cited by examiner

METHOD AND SYSTEM FOR GENERATING A PHOTO-RESPONSE FROM $MoS_2$ SCHOTTKY JUNCTIONS

CROSS REFERENCE TO RELATED APPLICATIONS

The present applications claims benefit of priority to U.S. Provisional Patent Application No. 61/552,914 filed Oct. 28, 2011 entitled ELECTRONIC AND OPTOELECTRONIC DEVICES USING SINGLE LAYER MoS2 and 61/616,202 filed Mar. 27, 2012 entitled METHOD AND SYSTEM FOR GENERATING A PHOTO-RESPONSE FROM MOS2 SCHOTTKY JUNCTIONS, both of which are incorporated herein by reference.

BACKGROUND

1. Field of the Embodiments

The embodiments described herein are generally directed to components incorporating molybdenum disulfide ($MoS_2$).

Figure 1A:
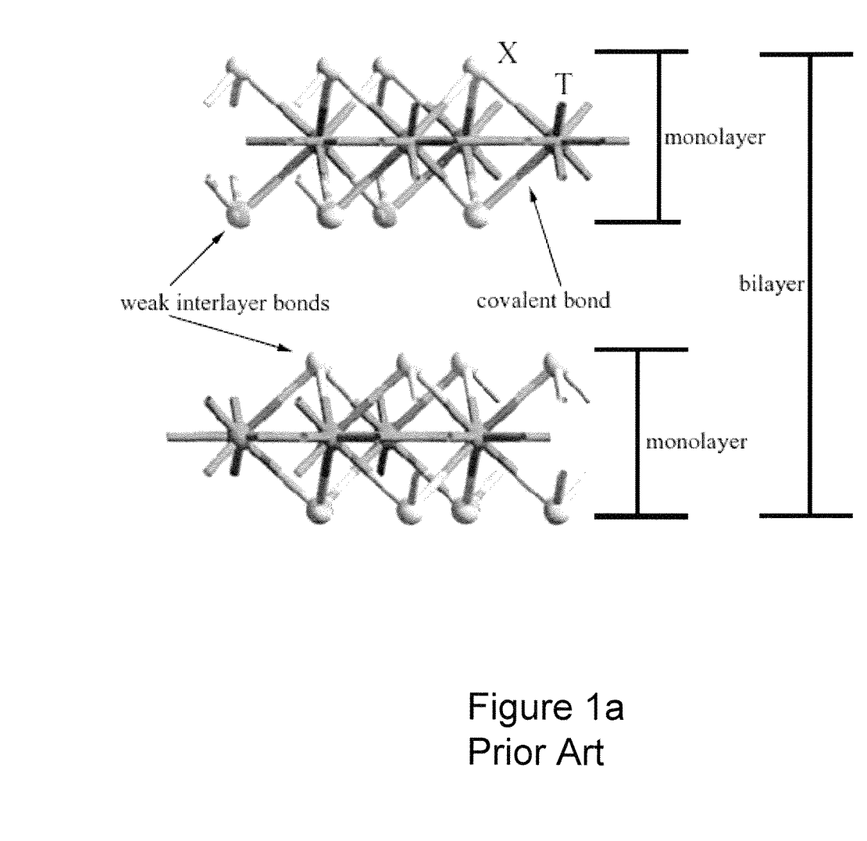
FIGS. 1a and 1b illustrate the known structure of $MoS_2$ and characteristics thereof.
Figure 1B:
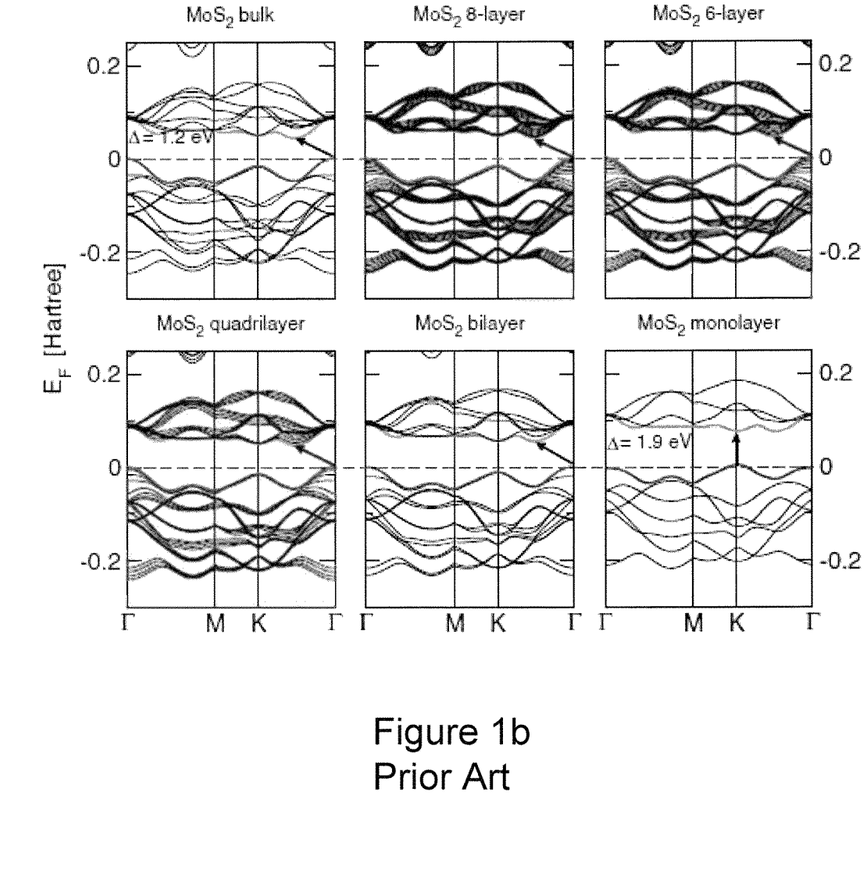

2. Description of the Related Art $MoS_2$ is a semiconductor made of layers that are weakly coupled by van der Waals forces and can be easily separated via chemical or mechanical exfoliation to obtain few-layer or single-layer samples. A layer is made of three atomic planes that are strongly bonded to each other: two hexagonal planes of sulfur atoms separated by one hexagonal plane of molybdenum atoms, with each molybdenum atom covalently bonded to six sulfur atoms in the adjacent planes (see FIG. 1a Layered structure of $MoS_2$, where X represents a S atom and T a Mo atom). Additional description may be found in A. Kuc et al., Influence of quantum confinement on the electronic structure of the transition metal sulfide TS(2), Physical Review B, 83 (2011) which is incorporated herein by reference. FIG. 1b illustrates the effect of quantum confinement on the band structure of $MoS_2$.

Bulk MoS2 is a semiconductor with an indirect bandgap of 1.2 eV. When the thickness is reduced to a few layers, the indirect bandgap is tuned by quantum confinement and increases by 0.5 eV or more, until it eventually exceeds the energy spacing of the direct gap for single-layer thickness, at about 1.9 eV. When varying the thickness, photoluminescence experiments have shown that the quantum yield increases by a few orders of magnitude for single-layer samples, confirming the crossover from indirect to direct gap. For a single layer, the quantum yield has also been found to be higher when the layer is suspended.

Figure 2A:
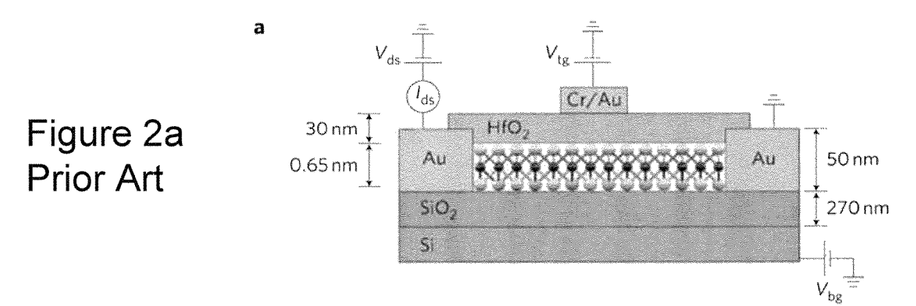
FIGS. 2a and 2b illustrate a prior art single layer $MoS_2$ transistor and characteristics thereof.
Figure 2B:
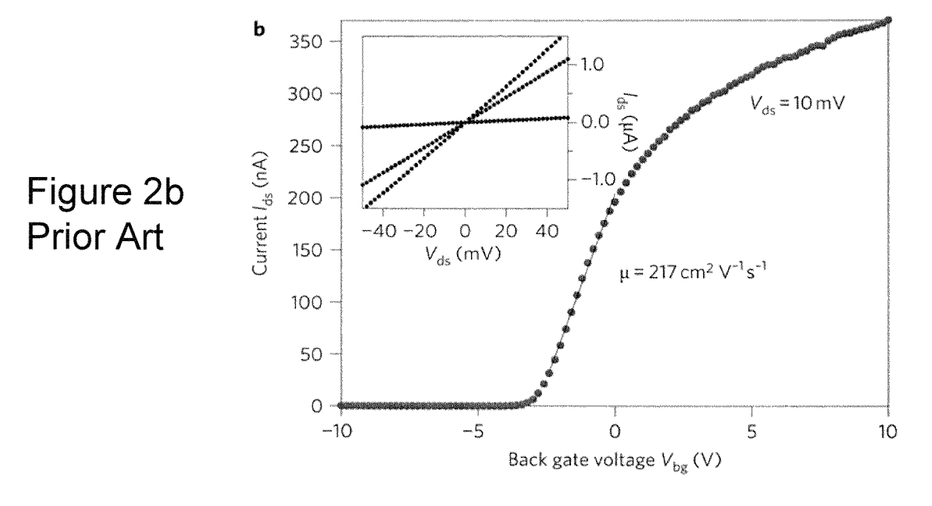

These results make single-layer $MoS_2$ a possible candidate for optoelectronics applications, as well as for other device applications where a large energy gap, a large surface area, and a high surface-to-volume ratio are crucial. Presently, the technological potential of this material still remains largely unexplored. Single-layer and few-layer transistors have been only recently realized by depositing thin flakes of $MoS_2$ on a doped silicon substrate capped with an insulating silicon dioxide layer. The $MoS_2$ thin flakes are first deposited using the same method that yielded the first successful single-layer graphene devices, i.e. mechanical exfoliation with scotch tape, then attachment of gold source and drain electrodes across the $MoS_2$ layer. The number of layers can be roughly sorted by contrast imaging with an optical microscope, whereas accurate measurements are obtained either by Raman spectroscopy or by AFM measurements of the thickness, which is about 0.65 nm for a single layer. In some devices, top gates with a different material for gate dielectric are also deposited (see FIG. 2a). Electrical characterization of the device is shown in FIG. 2b. The performance of $MoS_2$ devices has been found to vary greatly depending on the gate dielectric material. For example, $HfO_2$ gate oxide on single layer flakes yielded on-off current ratio as high as $1\times10^8$ and mobility higher than 200 $cm^2V^{-1} s^{-1}$ at room temperature. These first results show that transistors can be obtained.

There is a need in the art to advantageously implement $MoS_2$ in various processes and devices to improvements in light emitting devices, photoelectric devices, superconductivity and the like.

SUMMARY

In a first exemplary embodiment, a solid-state device includes: a channel formed of a single-layer of $MoS_2$ on a substrate; and a source contact formed of at least a first material and a drain contact formed of at least a second material on the substrate and in contact with first and second ends of the channel, wherein Schottky junctions are formed at an interface of at least one of the source and drain contacts and the channel exhibiting a photovoltaic effect.

In a second exemplary embodiment, a solid-state light emitting device includes: a channel formed of a single-layer of $MoS_2$ on a substrate; a source contact formed of at least a first material and a drain contact formed of at least a second material on the substrate and in contact with the channel; a dielectric layer formed on the single-layer of $MoS_2$ and the source and drain contacts; and first and second gate electrodes formed on the dielectric layer.

BRIEF DESCRIPTION OF THE FIGURES

The following figures exemplify the embodiments described herein and are intended to be reviewed in combination with the detailed descriptions provided below.

DETAILED DESCRIPTION

Ambipolar $MoS_2$ transistors with Au source-drain contacts were very recently demonstrated, but they were gated with ionic liquids (electrolytic gate) and the mechanism that leads to ambipolar transport in these samples is still unclear. By contrast, embodiments described and optimized through process discussed herein are all-solid-state devices that show either n-type or p-type transistor behavior, depending on the choice of electrode material. It has been found that when source and drain contacts are made of palladium (Pd); $MoS_2$ transistors always show p-type behavior. Devices made with two different contacts, Au and Pd, show asymmetric ambipolar behavior and diode characteristics in a wide range of gate voltages. These results can be explained assuming different work functions for Pd, $MoS_2$ and Au. The sizable photovoltaic effect measured within these devices is thought to arise from the built-in potential of the space charge accumulated at the source-drain contacts.

Figure 3:
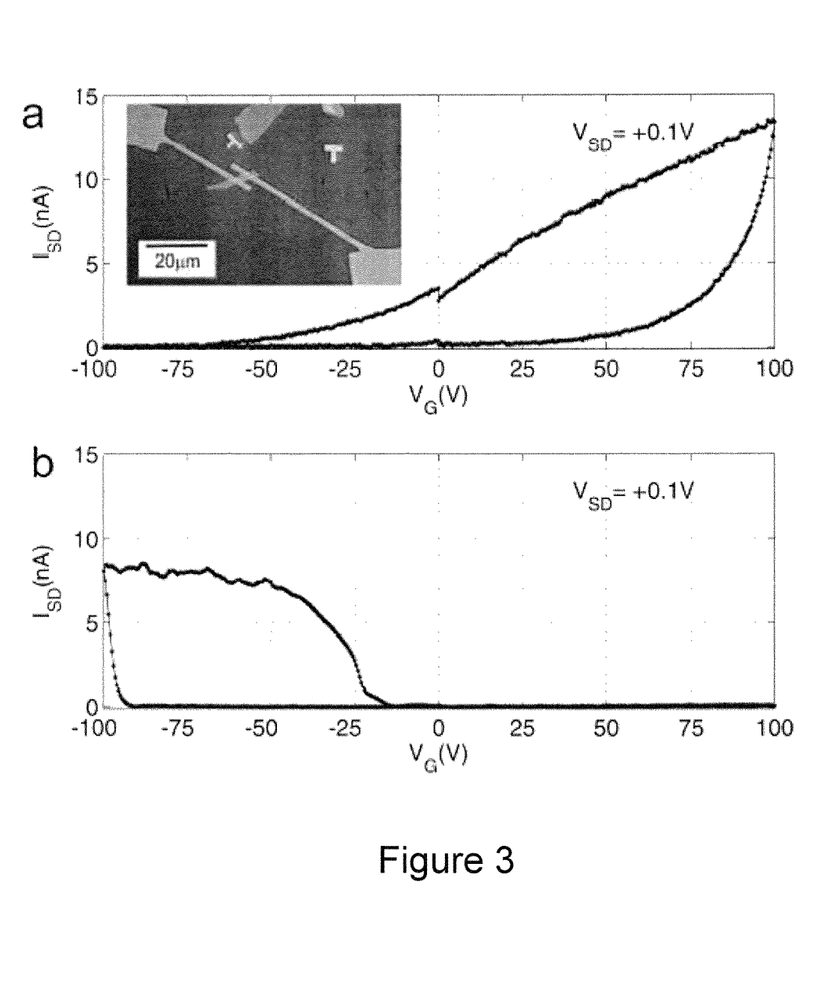
FIG. 3a shows a $MoS_2$ transistor with Au contacts resulting in only n-type behavior and FIG. 3b shows a $MoS_2$ transistor with Pd contacts resulting in only p-type behavior.

In a first embodiment, samples are made of exfoliated multi- and few-layer flakes of $MoS_2$ (about 50 nm thick) on a doped Si substrate capped with 300 nm $SiO_2$. Additional substrate materials may include glass, as well as flexible materials discussed below. Source and drain electrodes are patterned by e-beam lithography and deposited by sputtering. FIGS. 3a and 3b shows the transfer characteristics of two typical samples. In the case of Cr(2 nm)/Au(100 nm) source and drain electrodes, the device exhibits n-type behavior, similar to devices previously reported (FIG. 3a). Here we find that even extending the measurements to a very wide range of gate voltage, $-100 V < V_G < 100 V$, about 10 times wider than measurements previously reported, no p-type conduction can be measured. However, remarkably, in the case of Nb(2 nm)/Pd(100 nm) electrodes (FIG. 3b), the behavior is reversed and the sample shows only p-type conduction in the same range of gate voltage.

The reversed polarity is explained by assuming that 1) the thin adhesion layers of Cr and Nb can be neglected, since their thickness is too small to obtain a uniform film (that is, the adhesion layer is made of small disconnected islands or patches of metal) and the contact to the source and drain electrode is mainly made by the thick Pd and Au layers and 2) $\phi_{Pd} > \phi_{MoS2} > \phi_{Au}$, as shown schematically in FIG. 4a, 4b, where $\phi$ is the work function of each material. This will cause doping of the $MoS_2$ channel and accumulation of space charge in the contact region, yielding Schottky barriers and either upward (hole doping) or downward (electron doping) bending of the conduction and valence band edges.

In the case of electron-doping Au contacts (FIG. 4a), when a positive gate voltage is applied, the bands shift downward, the curvature of the band profile is reversed and the Schottky barrier becomes thinner, yielding higher tunneling current through the conduction band. For negative gate voltages, the bands shift upward, the curvature of the band profile increases and large barriers at the contacts block the source-drain current through the valence band. An analogous picture can explain the p-type transfer characteristics of the Pd devices, assuming that the situation for Pd contacts is just the opposite.

Figure 4:
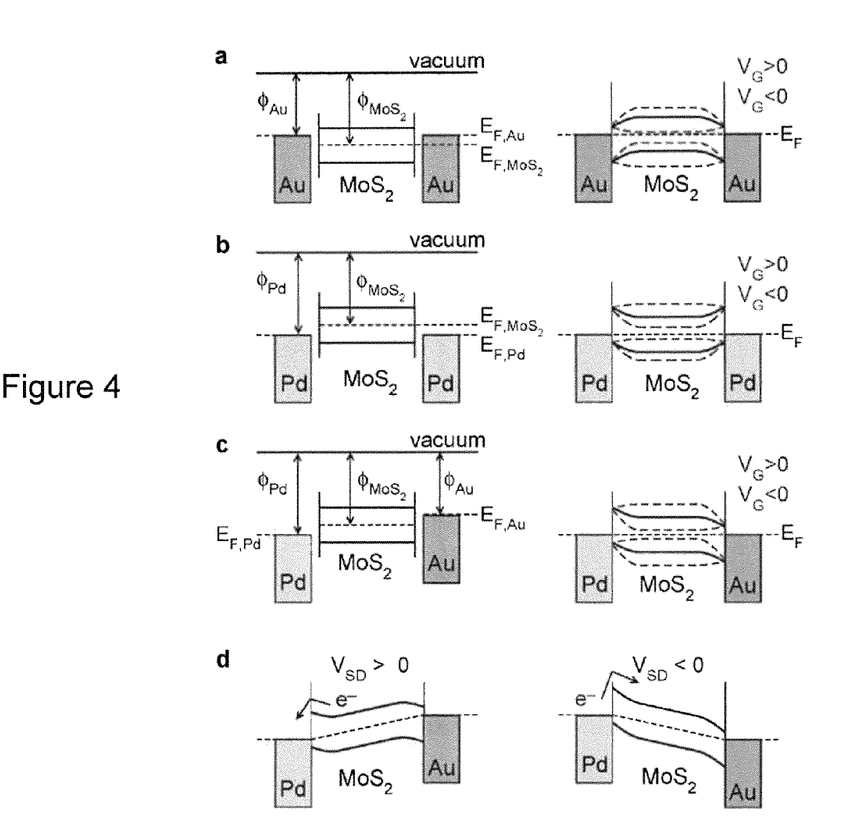
FIGS. 4a-4d illustrate $MoS_2$ transistor with varying electrode materials and band alignment characteristics thereof.

Although the literature values for the Au and Pd work functions are very similar, chemical interactions and charge redistribution at the interfaces change the alignment of Fermi levels for the Au/$MoS_2$ and the Pd/$MoS_2$ interfaces consistently with the scenario sketched in FIG. 4. This is also confirmed by our Kelvin probe measurements of Au and Pd work functions.

Figure 5:
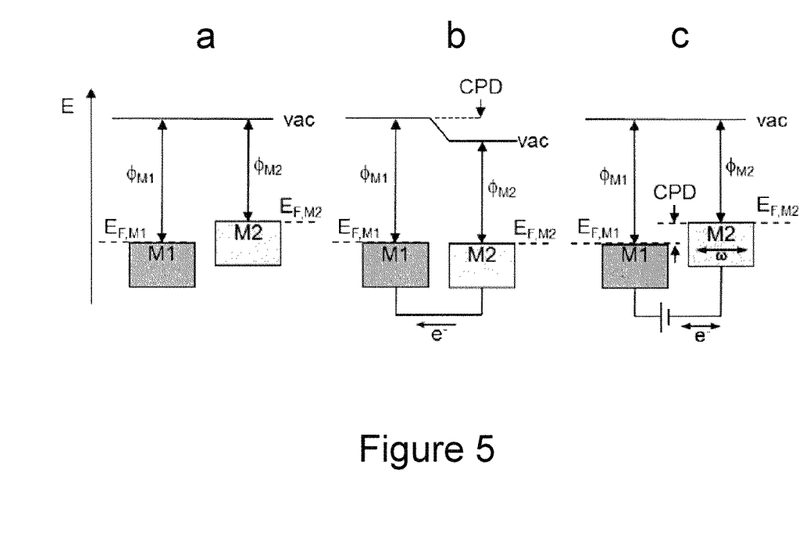
FIG. 5a-5c illustrates contact potential difference (CPD) between two dissimilar metals.

A Kelvin probe measurement tool (KP Technology—Wick, Scotland) uses the principle of a vibrating capacitor to determine work function of a metal, $\phi$. The technique determines the contact potential difference (CPD) between two dissimilar metals that are electrically connected to each other. With the two metals initially unconnected but under the same ambient condition (FIG. 5a), their vacuum levels align and their work functions will determine the difference in their Fermi levels. If the two metals are then electrically connected by a conducting wire, electrons will flow from the metal with the smaller work function, giving it a net positive charge, to that of the larger, which becomes negatively charged (FIG. 5b). This is a self-limiting process since electron transfer becomes impeded by the resulting electric field generated by the potential difference between the two metals, which at equilibrium, is exactly the work function difference, designated as the CPD. With the careful application of an external DC voltage to the capacitive circuit, the effect of the CPD can be counteracted to effectively produce a null potential difference (FIG. 5c).

In the actual Kelvin probe tool, one of the metals forms a suspended probe above the second sample metal under test, effectively forming a variable capacitor. The probe is actuated at a set frequency that generates a sinusoidal variation in current response, thereby allowing the capacitor to go through a charge/discharge cycle. The counterbalancing DC voltage is ramped from a negative to positive potential, and by plotting the IV curve, a zero value for AC current can be interpolated to determine the CPD.

Figure 6A:
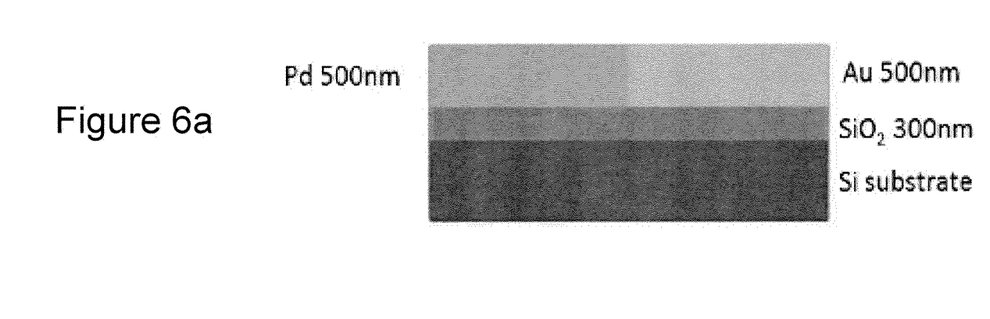
FIGS. 6a and 6b illustrate exemplary device testing structure and CPD measured at various times.
Figure 6B:
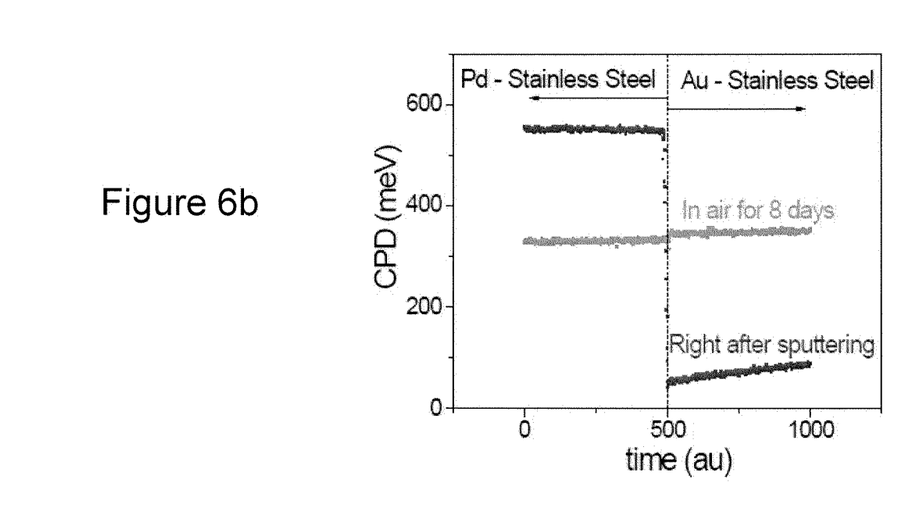

The Kelvin probe system is used to measure the work function of both gold and palladium (Pd) with respect to the stainless steel probe in two different states: one is to perform the measurement in air immediately after sputter deposition, while the second is after both samples have been in air for 8 days (FIGS. 6a and 6b). In FIG. 6a, the tested device is a 20 mm×20 mm×500 nm sample, half Pd and half Au, sputtered on a Si/$SiO_2$ substrate. It has been determined that the work function of Pd is indeed higher than the work function of Au right after sputtering, but their difference decreases after exposure to air.

Figure 7:
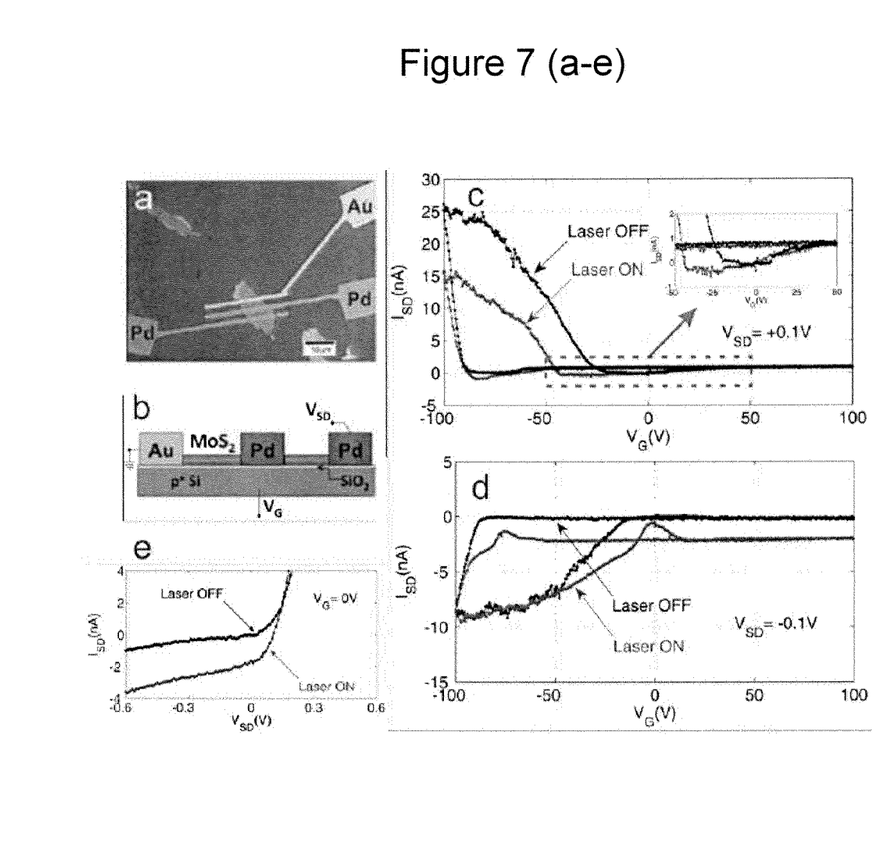
FIGS. 7a-7e illustrate: (a) Optical image of the device. The spacing between the electrodes is 2 μm. (b) Connections for source-drain bias and for gate-drain bias. (c) and (d) Transfer characteristics and photoresponse for a device with Pd—Au electrodes, for positive (c) and negative (d) source-drain bias. (e) Current vs. source-drain voltage showing strong asymmetry and photoresponse with diode-like behavior.

The effect of the electrode material on MoS2 was determined by using two Pd electrodes and one Au electrode on the same $MoS_2$ flake, as shown in FIG. 7a. When the Au contact is used as the drain electrode and either one of the Pd contacts is used as the source electrode, both p-type and n-type behavior can be measured, although the on-state current in the valence band is about one order of magnitude higher than the on-state current in the conduction band (FIG. 7b). The transfer characteristics measured at equal and opposite values of source-drain voltage, VSD, reveal a strongly asymmetric, diode-like behavior as a function of source-drain bias (FIGS. 7c, 7d). The corresponding current- vs. source-drain voltage (IV) curves also show diode-like behavior and photoresponse, when irradiated with a laser having photon energy larger than the gap (532 nm laser, photon energy about 2.3 eV, intensity of 1 mW/mm$^2$).

These results may be explained considering that the built-in Schottky potential at the Au/$MoS_2$ and the Pd/$MoS_2$ interfaces separates the electrons and holes generated by the absorbed photons and accumulates them at the electrodes, yielding an open-circuit voltage $V_{OC}$ 0.1 V, as shown by the laser ON curve in FIG. 7e. This work is the first demonstration of photovoltaic effect from $MoS_2$ flakes. Additional details related to the electrode study are described in similarly titled U.S. Provisional Patent Application Ser. No. 61/616,202 to which the present application claims benefit of priority and which is incorporated herein by reference in its entirety.

In accordance with the embodiments described in U.S. Provisional Patent Application Ser. No. 61/616,202, it is estimated that the maximum electrical power that can be extracted from the device is about 2.5% of the laser power incident on the $MoS_2$ region between the electrodes. This percentage is a lower bound for the conversion efficiency, because only the depletion region in the $MoS_2$ channel is photoactive. Nevertheless, this room-temperature efficiency is better than the highest value previously reported in $MoS_2$, which was about 1% at 120K for bulk samples.

The following variations to the devices described and illustrated herein are expected to enhance the photovoltaic effect and improve device characteristics.

In a first variation, the device as illustrated in FIG. 7b is fabricated using $MoS_2$ flakes formed with multiple layers. Though an increase in conversion efficiency would be expected when the energy gap goes from indirect to direct as the number of layers is decrease, recent work has predicted that reducing the thickness to a single layer could lead to significant excitonic effects due to reduced screening in 2-dimensionals, thereby hindering the electron-hole separation that is essential for the photovoltaic effect. Accordingly, multiple layer flakes may result in a balance of physical attributes that improves electron-hole separation while avoiding deleterious effects of increasing number of layers comprising the $MoS_2$ flakes.

In a second variation, the device as illustrated in FIG. 7b is fabricated wherein the spacing of the metallic electrodes forming the Schottky barriers with the $MoS_2$ will be varied, on the same flake. It is expected that as the distance between those electrodes becomes shorter than the electron-hole recombination length that the conversion efficiency will increase. Additional variations include fabrication of devices having sections of the $MoS_2$ flakes connected in series and in parallel with alternating Au/Pd electrodes, to create arrays of photodiodes with increased total open-circuit voltage and closed-circuit current, respectively.

In a third variation, the device as illustrated in FIG. 7b is fabricated using $MoS_2$ flakes with Au/Pd electrodes on flexible polymer substrates, such as polyimide or polydimethylsiloxane (PDMS), to test how the photovoltaic effect is affected by bending of the flexible substrate.

In a fourth variation, the device as illustrated in FIG. 7b is fabricated using $MoS_2$ flakes with Au/Pd electrodes as discussed here on substrates with reflective coating, to recycle photons that are not absorbed or are generated by recombination of electron-hole pairs into the creation of new pairs. Such a reflective surface is expected to increase photovoltaic efficiency. The reflective surface may be metallic including, but not limited to, Au, Al, Ag, Pt and/or multi-layer dielectric reflective films including, but not limited to, $TiO_2$, $SiO_2$, $Al_2O_3$, $Ta_2O_3$.

Figure 8A:
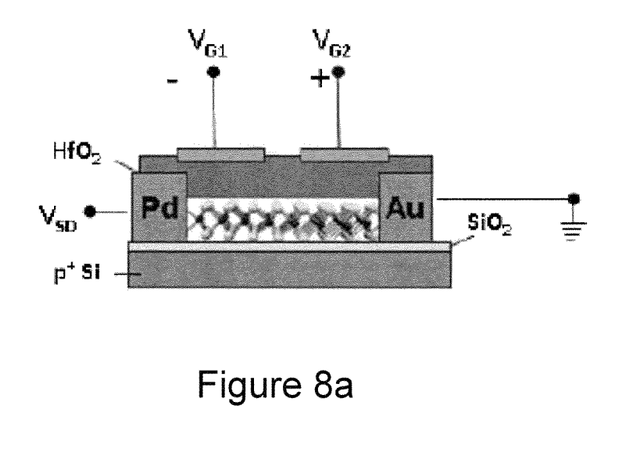
FIGS. 8a and 8b illustrate device in accordance with preferred embodiment and pn junction and light emission due to electron-hole recombination
Figure 8B:
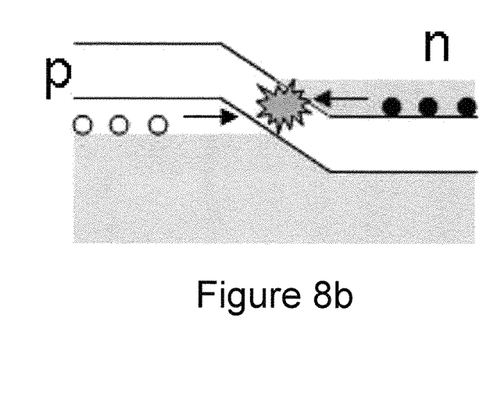

Returning to the single layer embodiment, FIGS. 8a and 8b illustrate a system wherein a pn junction is made by electrostatic doping of a single layer of $MoS_2$. Per above, the embodiments show ambipolar transport can be obtained in multilayer flakes. FIGS. 8a and 8b illustrate ambipolar transport in single-layer $MoS_2$ which allows for formation of pn junctions and the fabrication of nanoscale light sources.

In FIG. 8a a single layer of $MoS_2$ is deposited on a doped Si substrate which is capped with an insulating layer, e.g. $SiO_2$. Source and drain electrodes will be then deposited to contact the $MoS_2$ layer. The materials for source and drain are Pd and Au, respectively to provide local doping of opposite polarity at the interfaces between the electrodes and the $MoS_2$. A dielectric layer is grown by atomic layer deposition having a thickness in the range of 5 Angstroms to 100 nanometers and, as a final step, two separate gate electrodes are deposited on top of the structure. Initially, the transfer characteristic of the device as a function of the bottom gate is determined, to measure the ambipolar transport characteristics. The top gates are then biased with voltages of opposite sign to further shift the Fermi energy of the $MoS_2$ regions underneath them into the valence band and conduction band respectively, thereby obtaining a pn junction.

It is expected that light can be detected from the resulting pn junction. Forward biasing of this pn junction leads to electron-hole recombination in the junction region and emission of photons with energy matching the single-layer $MoS_2$ energy gap, 1.9 eV. Furthermore, radiative recombination of electron-hole pairs should be favored by the strong excitonic effects predicted in single-layer $MoS_2$. This light is in the visible portion of the electromagnetic spectrum and will be emitted from the gap separating the two top electrodes. The detector of a Raman Renishaw spectrometer may be used to measure the emitted light and its spectrum.

This type of light emitting pn junction, where the pn regions are obtained by electrostatic doping, has been already successfully used for carbon nanotubes. $MoS_2$ can be adapted to batch fabrication techniques much more easily than carbon nanotubes, which are not at all amenable to mass production. Accordingly, although to date MoS2 devices are currently fabricated by mechanical exfoliation, it is anticipated that similar to graphene, methods to grow single layer $MoS_2$ on wafers will be developed.

Successful detection of light from $MoS_2$ pn junctions is extremely attractive for both applications as well as basic science. For example, shrinking the size of the light source by confining electrons and holes may lead to new types of lasers with no threshold and no need of high Q cavity. High confinement can be obtained by forming pn junctions from $MoS_2$ nanoribbons, so this type of device can be used to build nanoscale light sources and to study possible occurrence of coherent emission due to confinement of electrons and holes. Nanoscale lasers have been recently demonstrated using surface plasmon oscillations, as a first step towards the development of on-chip optical computing. However, nanolasers achieved to date can only be pumped optically, whereas on-chip light sources for optical interconnects require electrical pumping, making $MoS_2$ light sources extremely desirable. In addition, arrays of light sources could be easily fabricated from $MoS_2$ layers.

There are still many open basic questions on transport properties of $MoS_2$, including the origin of the large hysteresis observed in most devices and whether it can be controlled or reduced, the contribution to the resistance due to the contact versus the scattering in the $MoS_2$ layers and the dependence of these contributions on the number of layers. Regarding scattering within few-layers or single-layer $MoS_2$, it is not clear whether ballistic transport can be achieved in these systems and what is the role played by the substrate and therefore the roughness of the gate oxide. However, zero resistance due to superconductivity has been measured in $MoS_2$ intercalated with sodium and potassium, yielding critical temperatures of a few Kelvin. Recently superconductivity has also been measured in thin $MoS_2$ flakes doped with an electrolytic gate, with critical temperatures up to 9 K. The authors find that superconductivity occurs only in a narrow region of gate voltage where the Fermi energy is shifted within the conduction band. These measurements suggest that the onset of superconductivity is related to the increase in charge carrier density. Superconductivity due to hole-doping, however, has not been reported. The following systems and processes are implemented to determine the transport properties of $MoS_2$ flakes, including the onset of field-effect superconductivity and its dependence on the doping, the number of layers, and quantum confinement obtained by cutting $MoS_2$ flakes into nanoribbons.

Initially, for both single- and few-layer $MoS_2$ flakes, electrodes are deposited with increasing spacing on the same flake to extract the contact resistance as well as the sheet resistance of the flake and its temperature dependence. This process is repeated for different electrode materials to find the material that provides the best contact to the flakes.

The influence of the substrate is determined by measuring the sheet resistance of flakes on different dielectric substrates deposited by atomic layer deposition, to investigate the effect of electron-phonon scattering and of the substrate on transport properties. Different dielectric layers are deposited by atomic layer deposition, including $HfO_2$ and $Al_2O_3$, and results studied. More particularly, characterization of the roughness of the layer and its effect on the $MoS_2$ transport properties is determined.

The onset of superconductivity in gated $MoS_2$ devices is determined by measuring the resistance as a function of temperature. The source-drain electrode material determined to provide the best contact to the $MoS_2$ is utilized. In the case of Pd electrodes, fully solid state devices are achieved where hole transport can be measured. These devices are cooled to low temperature (2.5K) and the gate is continuously scanned to shift the Fermi energy in the valence band and detect superconductivity in the hole-doping regions. This allows for differential study of the gate dependence of the superconducting properties when compared to samples with prior art electrolytic gate. This is because the electrolytic gate freezes at the low temperatures required to measure superconductivity, therefore the sample needs to be warmed up in order to effectively change the gate and the (electrically induced) doping, making a fine tuning of the gate very time consuming when using an electrolytic gate.

Additionally, superconductivity in suspended and gated $MoS_2$ flakes is determined. In suspended structures, electrons may couple to different phonon modes, yielding a different critical temperature.

Further, the $MoS_2$ flakes are cut in the shape of nanoribbons, to obtain a density of states with one-dimensional subbands and sharp van Hove singularities at the onset of each subband. The doping dependence of the superconducting properties is expected to be substantially different and yield higher critical temperatures. This is expected because the density of states increases dramatically when the Fermi energy is shifted into a van Hove singularity by applying a gate voltage to a nearby gate electrode. The nanoribbons are patterned by e-beam lithography and masking a narrow stripe of $MoS_2$ with PMMA prior to dry etching.

In recent prior art investigations of superconductivity in isolated carbon nanotubes in the field effect transistor configuration, an applied gate voltage can be used to shift the Fermi energy into van Hove singularities of the density of states, yielding transport features that can be interpreted as signatures of superconductivity, with critical temperature higher than 25 K for some samples. In single carbon nanotube devices, Andreev reflection at the contacts as well as thermal and quantum fluctuations strongly affect the temperature dependence of the resistance and cause a resistive tail below the critical temperature. The transition is expected to get much sharper when multiple nanotubes are coupled together. However, since the spacing of van Hove singularities depends on the carbon nanotube diameter and the nanotube diameter cannot be easily controlled, when samples are made with multiple nanotubes it is very difficult to shift the Fermi energy into van Hove singularities for all the nanotubes and optimize the critical temperature. As a result, reported critical temperatures of samples with multiple nanotubes have always been much lower than 25 K, but the superconducting transition was sharper. It has been argued that ropes are different from a system of uncoupled 1D conductors, because Cooper pairs can hop even between tubes of different helicity. In the case of few-layer $MoS_2$ nanoribbons, each layer can be considered as a 1D conductor coupled to the adjacent layers. These layers will have the same width, therefore the same spacing of van Hove singularities. Accordingly, it is possible to shift the Fermi energy into van Hove singularities for all the layers with a common gate voltage and achieve critical temperature higher than the 9K critical temperature recently reported for electrolytic gated $MoS_2$.

Processes described herein include optimization of devices for achieving superconductivity in single and/or few-layer $MoS_2$ devices through investigation of interface properties and charge scattering mechanisms, considering both electron and hole conduction. More particularly, investigative processes seek to improve electron mobilities and determine how to achieve and enhance hole conduction. In the prior art, for n-type conduction in single-layer $MoS_2$, mobilities of less than 10 $cm^2V^{-1}$ $s^{-1}$ were originally reported. The enhancement to 200 $cm^2V^{-1}$ $s^{-1}$ in the presence of the $HfO_2$ top gate as reported in the prior art is likely due to a reduction in impurity scattering by dielectric screening, though substrate-induced changes in the phonon properties could also reduce scattering of charge carriers.

Figure 9A:
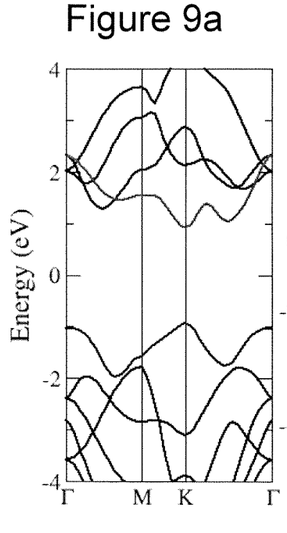
FIGS. 9a-9c illustrate: a) Calculated band structure of single layer $MoS_2$; b) parabolic fits to the bottom of the conduction band and top of the valence band and c) phonon spectrum, with Raman-active modes marked.
Figure 9B:
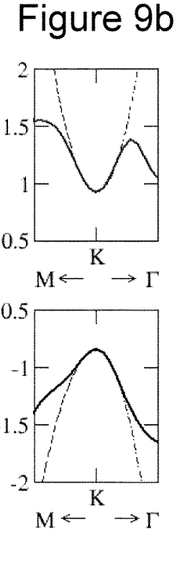

Recent prior art density-functional-theory (DFT) calculations of the intrinsic electron-phonon scattering mechanisms in n-type single-layer $MoS_2$ report an estimate of about 400 $cm^2V^{-1}$ $s^{-1}$ as the upper bound on the mobility. Present process embodiments assess mobility in the valence band to see whether the intrinsic limits on hole transport are more stringent. While the effective masses at the conduction band minimum and the valence band maximum in single-layer $MoS_2$ are calculated to be similar (see FIGS. 9a and 9b), with $m_e^* \sim 0.5$ $m_e$ and $m_v^* \sim 0.5$ $m_e$ to 0.75 $m_e$, the electron and hole states differ in character. The conduction band minimum at the K point is primarily of Mo $d_{z^2}$ character while the valence band maximum at K is mainly derived from in-plane d states. The interaction of electrons with phonons can therefore be very different depending on whether the carrier is in the conduction or valence band, leading to different mobilities. In addition to the intrinsic electron and hole mobilities, the effect of the substrate on phonon scattering in $MoS_2$ is also considered.

The mobility optimization in nanoscale systems contemplated the choice of contact material as well as the channel material in determining the electronic and transport properties of the system. Recent prior art computational studies of the electronic structure of single-layer $MoS_2$ in contact with various metals suggests that the most commonly used contact material, gold, may not be optimal, and that this may explain, in part, why conduction-band mobilities have not been as large as expected. Titanium was suggested as a better choice, given that the $MoS_2$/Ti interface has a high density of delocalized states at the Fermi energy. Optimization hereby includes determining compatibility in terms of atomic structure as well as electronic structure at the interface, and also determining Schottky barriers. An optimal contact material is identified to enhance p-type transport and to optimize the built-in potential necessary for separating charge in the photovoltaic effect.

Figure 9C:
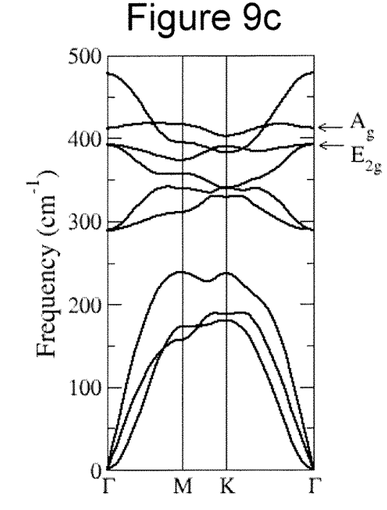

With regard to attaining superconductivity in $MoS_2$, an initial step is examination of the phonon spectrum calculated for a single layer of $MoS_2$ as shown in FIG. 9c. The Raman-active modes at the zone center are in good agreement with recent measurements. In a single-layer $MoS_2$ electrochemically gated field-effect transistor, these two Raman-active modes have been shown to respond very differently to electron doping. While the $E_{2g}$ mode is relatively insensitive to doping, the $A_{1g}$ mode softens and broadens considerably, suggesting a strong electron-phonon interaction. Indeed, DFT calculations confirm that the $A_{1g}$ phonon, which involves out-of-plane displacements of S ions, interacts strongly with the Mo $d_z^2$ states at the conduction band minimum, which renormalizes the phonon frequency due to enhanced screening. On the other hand, by symmetry, the $E_{2g}$ mode does not couple (to lowest order) to the states at the bottom of the conduction band, which explains its inertness with respect to electron doping.

Figure 10:
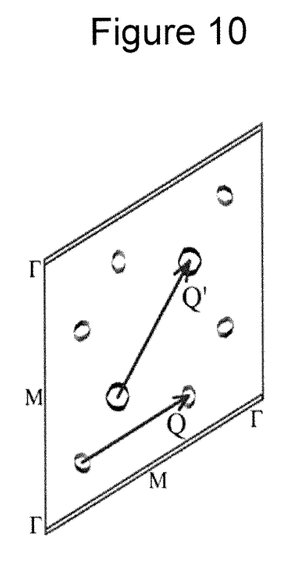
FIG. 10 illustrates Fermi surface with doping of electrons with in-plane versus out-of-plane character of the states.

Next, the process looks to determine whether the strong coupling of the $A_{1g}$ mode to electrons in the conduction band can also explain the superconductivity observed in electrolytically gated devices made of thin $MoS_2$ flakes. FIG. 10 shows the Fermi surface calculated for a single-layer of $MoS_2$ doped with 0.06 electrons per formula unit, corresponding to a carrier density of about $n=6\times10^{13}$ cm$^{-2}$. For comparison, in the prior art (Chakraborty et al., Symmetry-dependent phonon renormalization in monolayer MoS2 transistor, Physical Review B, 85 (2012) which is incorporated by reference herein), a gate voltage of 2 eV is estimated to yield carrier densities around $2\times10^{13}$ cm$^{-2}$. The Fermi surface of FIG. 10 shows that both the valley at K and the valley located about halfway between $\Gamma$ and K are occupied. Unlike the conduction band minimum at K, the $\frac{1}{2}(\Gamma K)$ valley consists of states with a strong mix of in-plane Mo d and in-plane S p character. For electron-phonon mediated superconductivity, interest is in phonons that couple states on the Fermi surface.

Current results show strong contributions to the electron-phonon coupling parameter from intervalley phonon wave vectors Q=M and Q'=K. While the optical $A_{1g}$ mode gives a large contribution at the zone center, corresponding to intrasheet coupling (Q=$\Gamma$), for Q=M and K, acoustic modes involving in-plane Mo motion and in-plane or out-of-plane S motion provide the largest contributions to the coupling constant. Although the coupling constant $\lambda_Q$ is large at and near these wave vectors, the phase space over which the coupling is non-zero is limited by the small size of the Fermi sheets. Nevertheless, for electron doping of 0.06 electrons per formula unit, we estimate a total coupling constant of $\lambda\sim0.9$. This is consistent with a superconducting $T_c$ on the order of a few K. For comparison, the potassium intercalated bulk material $K_xMoS_2$ has a peak $T_c$ of about 7 K when x=0.4, while electron-doped liquid-gated few-layer $MoS_2$ devices have been reported to show superconductivity around 9 K. The carrier density in the latter case is still unclear.

Since the location and character of the hole sheets of the Fermi surface are very different from those of the electron sheets, it is expected that different phonon modes will be important for superconductivity in the hole-doped case. In both the hole-doped and electron-doped cases, optimization includes the examination of the effect of carrier concentration, strain, number of layers, interlayer interactions, and further reduction of dimensionality (i.e., nanoribbons) on electronic structure, vibrational properties, electron-phonon coupling, and superconductivity. For example, in the electron-doped case, when the doping level is sufficient to start occupying the $\frac{1}{2}(\Gamma K)$ valleys, there should be a significant enhancement in superconductivity. Implementing methods to preferentially increase the density of states in these valleys, and to increase the size of the associated Fermi sheets, enlarges the phase space of phonons that couple these sheets. To make contact with the proposed nanoribbon, structures that are neither perfect armchair nor perfect zigzag ribbons may be considered.

One skilled in the art recognizes that there are variations to the configurations and optimization processes discussed herein. Those variations are considered to be within the skill in the art and the scope of the invention.

The invention claimed is:

1. A solid-state device comprising:
   a channel formed of a single-layer of MoS2 on a substrate; and
   a source contact formed of at least a first material and a drain contact formed of at least a second material which is different from the first material on the substrate and in contact with first and second ends of the channel, wherein Schottky junctions are formed at an interface of at least one of the source and drain contacts and the channel exhibiting a photovoltaic effect.

2. The device of claim 1, wherein the source contact further includes a first adhesion layer.

3. The device of claim 2, wherein the drain contact further includes a second adhesion layer.

4. The device of claim 2, wherein the first material is palladium and the first adhesion layer is niobium.

5. The device of claim 3, wherein the second material is gold and the second adhesion layer is chromium or titanium.

6. The device of claim 1, wherein the substrate is formed of a flexible polymer.

7. The device of claim 1, further comprising a reflective material located between the single-layer of MoS2 and the substrate.

8. The device of claim 1, wherein the distance between the source contact and the drain contact is shorter than the electron-hole recombination length of the device.

9. The device of claim 1, further comprising an array of photovoltaic devices, each photovoltaic device including a single channel formed of a single-layer of MoS2 and a single source contact and a single drain contact.

10. The device of claim 9, wherein the photovoltaic devices are connected in series.

11. The device of claim 9, wherein the photovoltaic devices are connected in parallel.

12. The device of claim 9, wherein a first subgroup of the photovoltaic devices are connected in parallel and a second subgroup of the photovoltaic devices are connected in series.

13. The device of claim 1, wherein the channel is formed of multiple layers of MoS2.

14. A solid-state light emitting device comprising:
   a channel formed of a single-layer of MoS2 on a substrate;
   a source contact formed of at least a first material and a drain contact formed of at least a second material which is different from the first material on the substrate, and in contact with the channel;
   a dielectric layer formed on the single-layer of MoS2 and the source and drain contacts; and
   first and second gate electrodes formed on the dielectric layer.

15. The device of claim 14, wherein the source contact further includes a first adhesion layer.

16. The device of claim 15, wherein the drain contact further includes a second adhesion layer.

17. The device of claim 15, wherein the first material is palladium and the first adhesion layer is niobium.

18. The device of claim 16, wherein the second material is gold and the second adhesion layer is chromium or titanium.

19. The device of claim 14, wherein the dielectric material has a thickness in the range of 5 Angstroms to 100 nanometers.

20. The device of claim 14, wherein the substrate is doped silicon.

21. The device of claim 14, wherein the channel is formed of multiple layers of MoS2.

22. The device of claim 14, wherein the first and second gate electrodes are formed of gold.

* * * * *